United States Patent
Schmid et al.

(10) Patent No.: US 10,782,369 B2
(45) Date of Patent: Sep. 22, 2020

(54) TRANSPORT APPARATUS FOR TEMPERATURE-CONTROLLED NMR TEST SAMPLES HAVING A DOUBLE TUBE SYSTEM

(71) Applicant: BRUKER SWITZERLAND AG, Faellanden (CH)

(72) Inventors: Reto Schmid, Winterthur (CH); Sven Sieber, Seegraeben (CH)

(73) Assignee: BRUKER SWITZERLAND AG, Faellanden (CH)

( * ) Notice: Subject to any disclaimer, the term of this patent is extended or adjusted under 35 U.S.C. 154(b) by 0 days.

(21) Appl. No.: 16/381,054

(22) Filed: Apr. 11, 2019

(65) Prior Publication Data

US 2019/0317162 A1    Oct. 17, 2019

(30) Foreign Application Priority Data

Apr. 12, 2018   (DE) .......................... 10 2018 205 535

(51) Int. Cl.
   *G01R 33/30* (2006.01)
   *G01R 33/31* (2006.01)
   *G01R 33/46* (2006.01)

(52) U.S. Cl.
   CPC .......... *G01R 33/307* (2013.01); *G01R 33/31* (2013.01); *G01R 33/46* (2013.01)

(58) Field of Classification Search
   USPC ....................................................... 324/307
   See application file for complete search history.

(56) References Cited

U.S. PATENT DOCUMENTS

| 4,859,948 | A | 8/1989 | Kuster |
| 6,768,305 | B1 | 7/2004 | Keifer |

(Continued)

FOREIGN PATENT DOCUMENTS

| DE | 3729819 C2 | 3/1989 |
| DE | 102013212312 B4 | 12/2014 |

(Continued)

OTHER PUBLICATIONS

Office Action from German Patent & Trademark Office dated Dec. 17, 2018, 3pp and translation thereof , 2pp.

(Continued)

*Primary Examiner* — Rodney E Fuller
(74) *Attorney, Agent, or Firm* — Edell, Shapiro & Finnan, LLC

(57) ABSTRACT

Transport apparatus pneumatically conveying NMR test samples (2) from or to an NMR spectrometer (1) through a tubular transport channel (3) includes a device (4) generating positive pressure in the end of the transport channel that is remote from the spectrometer. The transport channel has a tube system which has a gas-tight outer tube (5) having an outer diameter $D_a$ and an inner diameter $d_a$ and an inner tube (6), arranged coaxially with respect to the outer tube, having an outer diameter $D_i < d_a$ and an inner diameter $d_i$. The inner diameter $d_i$ of the inner tube is greater than or equal to the outer diameter $D_P$ of the test samples, and the inner tube includes mutually spaced cross-holes (7) designed as through-holes. This provides accurate current position determinations for the sample in the transport channel, and reduced risk of damaging the sample during transport.

19 Claims, 5 Drawing Sheets

(56) References Cited

U.S. PATENT DOCUMENTS

| | | | |
|---|---|---|---|
| 8,217,655 B2 | 7/2012 | De Vries et al. | |
| 9,726,735 B2 * | 8/2017 | Schmidig | G01R 33/307 |
| 2002/0196022 A1 * | 12/2002 | Tschirky | G01R 33/307 |
| | | | 324/321 |
| 2007/0007963 A1 * | 1/2007 | Kawasaki | G01R 33/31 |
| | | | 324/321 |
| 2015/0002152 A1 | 1/2015 | Schmidig et al. | |
| 2015/0198681 A1 | 7/2015 | Chintalapati | |
| 2015/0204952 A1 | 7/2015 | Schett et al. | |
| 2016/0033599 A1 * | 2/2016 | Song | G01N 24/08 |
| | | | 324/309 |
| 2016/0231397 A1 * | 8/2016 | Mizuno | G01R 33/3403 |

FOREIGN PATENT DOCUMENTS

| | | |
|---|---|---|
| DE | 102014201076 B3 | 3/2015 |
| EP | 2199816 B1 | 6/2010 |

OTHER PUBLICATIONS

Bruker BioSpin AG; "Bruker Sample Transport. BST Installation and Technical Manual Version 002"; Nov. 21, 2008.

* cited by examiner

TRANSPORT APPARATUS FOR TEMPERATURE-CONTROLLED NMR TEST SAMPLES HAVING A DOUBLE TUBE SYSTEM

CROSS REFERENCE TO RELATED APPLICATIONS

This application claims foreign priority under 35 U.S.C. § 119(a)-(d) to German Application No. DE 10 2018 205 535.1 filed on Apr. 12, 2018, the entire contents of which are hereby incorporated into the present application by reference.

FIELD OF THE INVENTION

The invention relates to a transport apparatus for pneumatically conveying NMR test samples from a region outside an NMR spectrometer through a tubular transport channel into the NMR spectrometer and, from there, optionally after NMR measurement has been carried out on the NMR test samples, back outside the NMR spectrometer, the transport apparatus comprising a device for generating positive pressure in the end of the tubular transport channel that is remote from the spectrometer.

BACKGROUND

NMR spectrometers having transport apparatuses of this kind have been produced and distributed by the applicant for many decades already. These spectrometers are described in DE 37 29 819 C2 (reference [1]), for example.

A transport device for pneumatically conveying the NMR measurement samples is known from the company brochure "Bruker Sample Transport. BST Installation and Technical Manual Version 002", Bruker BioSpin AG, 21 Nov. 2008 (reference [2]), in particular from chapters 2, 3 and 5.7-5.9 of this publication. In the following, a transport device of this kind is abbreviated to "BST".

NMR methods have been used for more than half a century for rapid and accurate analysis of the chemical composition of test samples or for determining the structure of substances contained in the samples. These methods can be carried out in NMR spectrometers. NMR spectrometers that are suitable for these purposes are described in EP 2 199 816 B1 and in U.S. Pat. No. 8,217,655 B2 (reference [3]), for example.

NMR spectroscopy is an efficient method in instrumental analysis. In these NMR methods, the sample is exposed to a powerful static magnetic field $B_0$ in a z direction. This leads to interaction with the nuclear spin of the sample material, in particular to alignment of nuclear spin in the measuring substance. Radio-frequency (RF) electromagnetic impulses which are orthogonal thereto are irradiated into the sample in the x or y direction. The development over time of this nuclear spin of the sample in turn generates radio-frequency electromagnetic fields, which are detected in the NMR equipment. Information regarding the properties of the sample can be obtained integrally over a specific spatial region from the detected RF fields. In particular, conclusions as to the chemical composition and the chemical bond ratios in the sample can be drawn from the position and intensity of NMR lines.

The test sample usually consists of a cylindrical sample test tube having a typically circular, oval or rectangular cross section, which test tube contains the solid or liquid substance to be measured. The sample test tube is sealed at least at the end that first penetrates the probe of the NMR spectrometer, and is typically located in a transport container (the so-called spinner). Sample test tubes and spinners are transported from outside the magnet into the probe using the transport system. Reference [1] cited at the outset describes a transport device for conveying a sample test tube of this kind between an entry point, at which it is inserted into and can be removed from the transport device, and a supply point, at which the sample test tube can be supplied to a room-temperature tube of a cryostat, the entry point being spaced apart from the supply point both horizontally and vertically, and a tubular transport channel being provided for pneumatically conveying the sample test tube from a first transfer point at a lower end of the transport tube to a second transfer point at the upper end thereof.

In the following, it is assumed that the insertion opening is at the top of the probe of the NMR spectrometer and the sample test tube is therefore inserted into the probe from above. However, it is also conceivable to insert the sample test tube into the probe from below through an opening provided for this purpose. This case is similar to that mentioned above, and, since it is sufficiently analogous, will not be described in more detail here. When the sample test tube has reached the measuring position, the spinner is inside a turbine. This turbine allows rotation of the sample test tube (see e.g. DE 10 2013 212 312 B4, reference [4]).

U.S. Pat. No. 6,768,305 B1 (reference [5]) describes a sample changer and transporting temperature-controlled NMR test samples into an NMR spectrometer. In this arrangement, signals are also generated for detecting the location of the test sample in the transport system.

DE 10 2014 201 076 B3 (reference [6]) discloses a transport apparatus for transporting an NMR sample to the probe of an NMR spectrometer. The transport apparatus comprises a transport container for the sample having a specially modified locking device. The transport container is designed such that it can be used for transporting both an HR-NMR sample spinner having an inserted sample test tube and an NMR MAS rotor. It is therefore possible to rapidly switch between NMR spectroscopy of liquids to that of solid bodies and vice versa without modifying the transport system, merely by exchanging the probe.

In general, the idle time between two consecutive measurements in the NMR system should be as short as possible. It should therefore be possible to exchange the NMR test samples as quickly as possible. DE 10 2018 201 226.1 (reference [7]), which was not yet published as of the filing date of the present patent application, proposes a suitable automatable and compact quick-change system having a sensor device for detecting a transport container and having specific parking receptacles for temporarily storing a transport container arriving in the spectrometer.

As already indicated above, the NMR test sample is usually placed into a transport carrier (also referred to as a "spinner" or "shuttle") and is transported in a (theoretically cylindrical) transport tube via a gas flow (usually nitrogen or air).

However, it is difficult to control the current position of the transport carrier in the transport tube.

There is usually no fixed relationship between the intensity of the gas flow and the position of the transport carrier. As shown below in FIG. 4, in the currently-used transport system according to the prior art, there is a large degree of uncertainty regarding the precise current position of the NMR test sample in the transport channel. This can be clearly seen from the constantly and somewhat significantly increasing height of the error bar in FIG. 4. However, this uncertainty prevents careful, robust but nevertheless rapid transportation of the NMR test sample. Due to the large mass of a conventional transport carrier in comparison with the mass of the NMR test sample, the sample test tube, which is usually made of glass, containing the NMR test sample may be slightly damaged. In addition, it has not yet been possible to effectively control the temperature of the transport tube due to its large mass and position in the magnet.

SUMMARY

An object of the present invention is to modify a transport apparatus of the type defined at the outset using simple technical measures, such that the disadvantages listed above can be completely or at least largely prevented without reducing the quality of the NMR measurements in the process. It is a further object to keep the NMR equipment compact and to keep additional material costs and further production expenditure negligible.

In particular, the invention facilitates determining the current position of the NMR test sample in the transport channel as accurately as possible, but also in as technically simple and robust a manner as possible. The risk of damaging the NMR test sample during transport thereof through the transport channel is significantly reduced. The invention also facilitates effective control of the temperature of the test samples in advance, such that an NMR experiment can be initiated immediately and without further preparation time directly after the relevant test sample has been transported into the magnet center. Finally, the modification according to the invention of the known transport apparatus permits existing systems according to the prior art to be updated without significant alterations, for example for the Sample-Jet and the SampleCase manufactured by the applicant.

These relatively complex objects are solved in a surprisingly simple yet effective way in that, in a transport apparatus of the type in question for pneumatically conveying NMR test samples, having the features defined at the outset, the tubular transport channel has a tube system which comprises a gas-tight outer tube having an outer diameter $D_a$ and an inner diameter $d_a$ and an inner tube, arranged coaxially with respect to said outer tube, having an outer diameter $D_i < d_a$ and an inner diameter $d_i$, the inner diameter $d_i$ of the inner tube being selected so as to be greater than or equal to the outer diameter $D_P$ of the NMR test samples, and in that the inner tube comprises cross-holes that are mutually spaced in the axial direction and are designed as through-holes.

The transport apparatus according to the invention therefore comprises, in contrast to the previously conventional design of the simple transport tube, a transport channel that comprises a gas-tight outer tube and an inner tube arranged coaxially therein at a radial distance. The cross-holes, which are specified according to the invention, of the inner tube allow a certain amount of the transport gas injected in from the positive-pressure device to escape into the cavity between the two tubes. Owing to the counter-pressure produced by the NMR test sample in the inner tube, the gas flow below the NMR test sample in each case uses this opportunity to escape. This has the significant advantage that the higher the NMR test sample rises in the inner transport tube, the more gas disappears through these small cross-holes. This results in a fixed relationship between the magnitude of the gas flow and the current axial position of the NMR test sample in the inner transport tube.

In pneumatic terms, the double tube system according to the invention behaves like a geometrically conical, simple transport tube of which the cross section tapers from the bottom to the top towards the spectrometer, but which is of course significantly more difficult to produce than the double tube system according to the invention. By using a "pneumatically conical" transport tube of this kind, the current axial position of the transport carrier is directly dependent on the current volumetric flow rate of the transport gas and therefore is known in principle at each point of the transport process, without using additional complex detection equipment. In addition, various acceleration zones, in which the NMR test sample can be transported particularly rapidly, are produced by with the cross-holes (which are initially freely positionable and the size and number of which is freely selectable) in the axial direction of the double tube system.

Overall, highly robust, careful and yet particularly rapid transport of the NMR test sample can be achieved without the need for particular calibration for different masses. If the mass of the transport carrier is also greatly reduced or the transport carrier is even omitted altogether, the possibility of damaging the NMR test sample during transport thereof is significantly reduced.

Precisely owing to the possibilities, disclosed by the invention, of improved automated rapid supply of NMR test samples (which are ideally even already temperature-controlled in advance), it is possible to keep the NMR measuring cycle very short, as controlling the temperature of the NMR test samples in the spectrometer in advance can easily be brought forward to the period of the transport of the samples through the transport channel, and therefore no longer (unnecessarily) prolongs the NMR measuring cycle. There are significant economic advantages to reducing the time of the measuring cycle, as more measurements can be carried out in the same period.

At this point, it should be explicitly noted that the advantages of the invention can be achieved not only in vertical NMR spectrometers, but also in NMR systems having a horizontal or oblique z axis. The specified axial positions do not necessarily have to be "above" or "below" the NMR magnet coil system, but can optionally be adjacent thereto "on the right" or "on the left". In any case, gravity plays a minor role in the mode of operation of the present invention.

Depending on the specific intended use, embodiments of the transport apparatus according to the invention in which the cross-holes are arranged in the axial direction of the inner tube at various distances and/or various cross-hole diameters may be particularly beneficial. For example, this may be advantageous if a non-linear transport profile (gas flow with respect to transport distance) having a gentle acceleration phase is required, for example when transporting fragile, thin-walled NMR sample tubes.

However, one type of embodiment of the transport apparatus according to the invention is particularly advantageous in which the cross-holes are arranged equidistantly in the axial direction of the inner tube. This can be advantageous in particular in the central transport region between the magnet center and a magnetic hole that is open at the top, if the NMR test sample is intended to be conveyed at a constant speed.

Further advantageous embodiments of the invention are characterized in that there is a thermal insulator surrounding the outer tube. A temperature-controlled transport tube, preferably at the measuring temperature provided for the NMR test sample, has the result that the temperature of the NMR test sample does not change during transport. As a result, the NMR measurement can be initiated as soon as the sample has arrived in the probe, without additional waiting time for temperature stabilization.

An embodiment of the transport apparatus according to the invention is also preferred in which a protective sleeve surrounds the tube system.

As a result, the often highly sensitive thermal insulation is protected such that it cannot be impaired or damaged when the system is installed and removed.

Moreover, one type of embodiment of the invention is advantageous in which the transport apparatus comprises a device for generating negative pressure in the end of the tubular transport channel that is nearer the NMR spectrometer. Sucking the NMR sample is advantageous for the gas flow system in the NMR probe in that the temperature-control gas escaping from the NMR probe can flow out unobstructed, and sucking the NMR sample out of a storage unit (e.g. a rack) and also the NMR measuring cell is also easily achievable.

In further preferred embodiments, the double tube system according to the invention is designed such that it can be arranged radially inside a standard transport tube according to the prior art.

This has the advantage that existing NMR magnet systems can also be retrofitted with the new transport system, which takes into account the fact that the NMR magnets typically have a very long service life and period of use of 20-30 years.

In practice, embodiments have proven effective in which the tube system has the following dimensions:
outer diameter $D_a$ of the outer tube: 15 mm≤$D_a$≤30 mm, preferably 18 mm≤$D_a$≤26 mm;
inner diameter $d_a$ of the outer tube: 10 mm≤$d_a$≤25 mm, preferably 15 mm≤$d_a$≤20 mm;
outer diameter $D_i$ of the inner tube: 7.5 mm≤$D_i$≤15 mm, preferably 10 mm≤$D_i$≤12 mm;
inner diameter $d_i$ of the inner tube: 5 mm≤$d_i$≤10 mm, preferably 8.5 mm≤$d_i$≤9.5 mm;
axial distance $A_Q$ between the cross-holes: 50 mm≤$A_Q$≤300 mm.

In this case, the diameter of the tubes can be selected depending on the material, such that the mechanical stability (in particular bending stress), thermal properties (e.g. expansion, heat conduction, etc.), tribological properties (in particular friction) and electrical conductivity (particularly electrostatic charge) are optimized for the intended use.

This allows cost-effective and efficient production.

Embodiments of the transport apparatus according to the invention are advantageous in which, during operation, the NMR test samples are surrounded by a transport container having a mass $M_T$<<50 g, in particular $M_T$<40 g, preferably $M_T$≤25 g. This is advantageous as the current standard transport container can also be used in the new transport method, which may have a positive effect on customer acceptance, as the customer can continue to use his many transport containers.

Finally, a type of embodiment of the transport apparatus according to the invention is preferred which is characterized in that, during operation, the NMR test samples are each located in a preferably cylindrical sample test tube having an outer diameter $D_{PR}$, and in that, during operation, the sample test tubes are each sealed in a fluid-tight manner by a closure cap which is attached at one end and has a maximum outer diameter $D_{VK}$. By dispensing with the transport container, which is heavy in comparison with the weight of the NMR test sample, much faster transport cycles having correspondingly higher accelerations can be used, without running the risk of damaging the sensitive NMR test sample, e.g. breaking the glass. Moreover, the reduced weight also results in a significant reduction in the use of transport gases.

In advantageous developments of this type of embodiment, the sample test tubes and the closure caps are dimensioned such that: $d_i$≥$D_{VK}$>$D_{PR}$. The closure cap simultaneously assumes the function of the sealing lip in order to generate lift in the transport tube. The existing closure caps of the standard 4-inch NMR test samples can already fulfil this function today.

A method for operating a transport apparatus according to the invention of the kind described above is also covered by the present invention, the method comprising the following steps:

(a) supplying an NMR test sample which is acquired from a feed point, in particular a preparation robot, outside the NMR spectrometer through the external part of the transport channel to the entry point into the NMR spectrometer;

(b) moving the NMR test sample into a spatial position which is favorable for further transport into the NMR magnets and is preferably parallel to the magnet axis;

(c) introducing the NMR test sample through the internal part of the transport channel into the magnet center of the NMR magnet system in a pneumatically controlled manner;

(d) carrying out an NMR measurement on the NMR test sample in the magnet center of the NMR system;

(e) pneumatically transporting the NMR test sample back out of the magnet center to outside the NMR spectrometer;

(f) optionally further transporting the measured NMR test sample through the external parts of the transport channel back to the feed point, e.g. a preparation robot.

In an NMR spectrometer having a vertical room-temperature hole, the entry point is typically at the top of the NMR system. The preferred positioning of the sample test tube containing the NMR test sample in step (b) is carried out such that the longitudinal axis of the test tube is in the vertical direction. A plurality of other NMR test samples may already be stored in the NMR system, which samples are brought to the preferred NMR measuring temperature, usually by being heated, and/or are maintained at the desired temperature. A significant advantage of this method is, inter alia, rapid exchange of each of the samples to be measured, as well as more reliable transport in the case of NMR test samples of different weights than is currently possible.

Advantageous developments of this method are characterized in that the current axial position of the NMR test sample is known from the ratio of the air escaping from the cross-holes to the total volumetric flow rate and the direct relationship, produced as a result, between the total volumetric flow rate and the axial position of an NMR test sample in the transport channel. This allows more reliable operation with shorter exchange times even in the case of variations, due to production, in the geometry and the weight of the NMR test sample.

Alternatively or additionally, developments of the method according to the invention can be used in which the inner tube is maintained at a constant temperature, preferably at the temperature of the NMR test sample, during the NMR measurement by using the thermal insulation apparatus surrounding the outer tube, said temperature being thermally insulated from the unregulated temperature of the transport channel.

A temperature-controlled transport tube, preferably at the measuring temperature provided for the NMR test sample, has the result that the temperature of the NMR test sample does not change during transport. As a result, the NMR measurement can be initiated as soon as the sample has arrived in the probe, without additional waiting time for temperature stabilization.

Variants of the method according to the invention are also preferred which are characterized in that, in order to carry out an NMR measurement, the NMR test sample is sucked into the NMR spectrometer with the device for generating negative pressure, in addition to being blown at by the device for generating positive pressure. Sucking the NMR test sample is advantageous for the gas flow system in the NMR probe, because the temperature-control gas escaping from the NMR probe can flow out unobstructed as a result, and sucking the NMR test sample out of a storage unit (e.g. a rack) and also an NMR measuring cell is also easily achievable in technical terms.

Finally, an NMR spectrometer comprising a transport apparatus of the type described above, which is modified according to the invention, also falls within the scope of the present invention.

Further advantages of the invention can be found in the description and the drawings. Likewise, the features mentioned above and set out in the following can, according to the invention, each be used individually per se or together in any combinations. The embodiments shown and described are not to be understood as an exhaustive list, but instead are of an exemplary nature for describing the invention.

BRIEF DESCRIPTION OF THE DRAWINGS

The invention is shown in the drawings and will be described in greater detail with reference to embodiments.

In the drawings.

DETAILED DESCRIPTION

Figure 1:
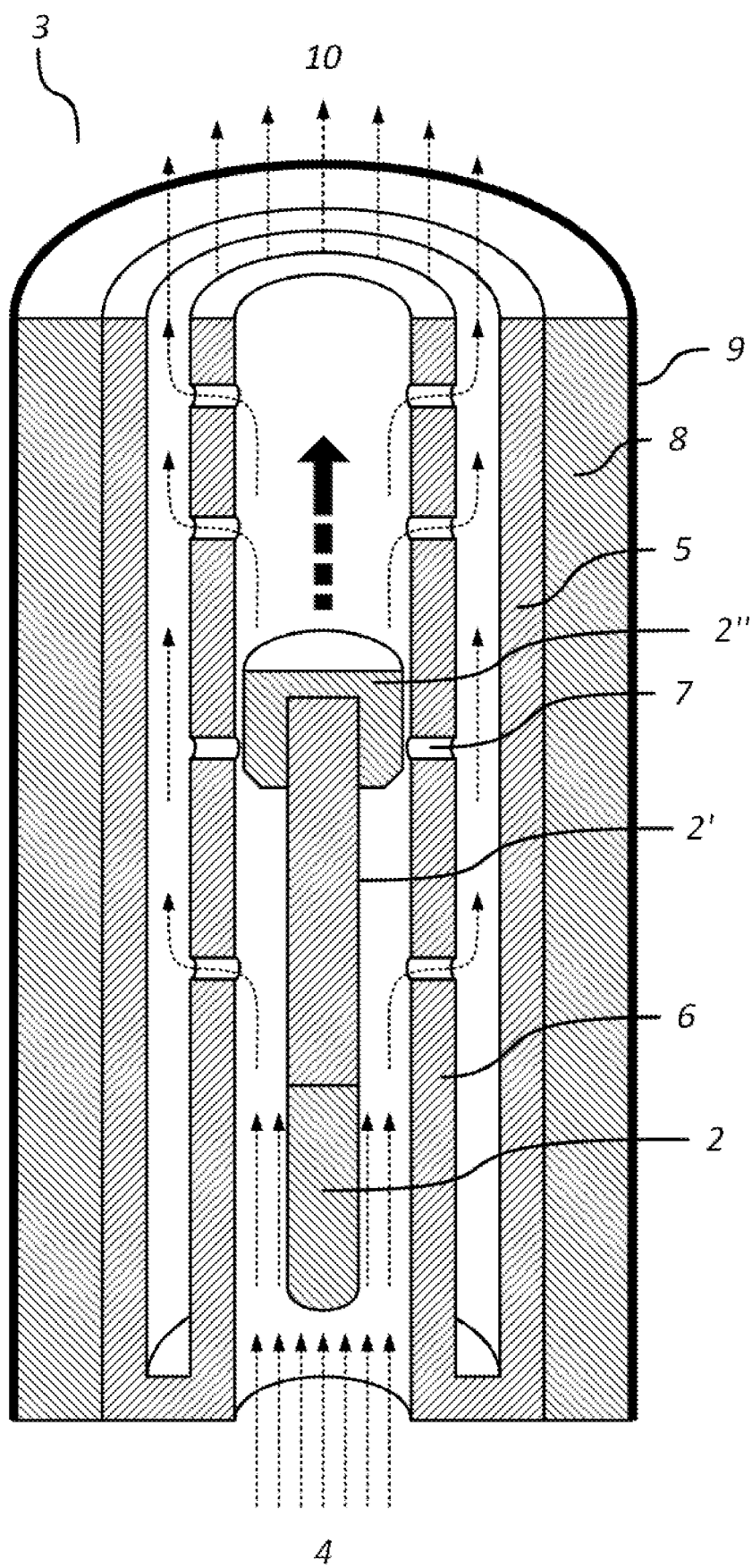
FIG. 1 is a schematic, partial, vertical sectional view of an embodiment of the transport apparatus according to the invention having an NMR test sample without a transport container, but with a closure cap.

In general, the present invention concerns a modified transport apparatus of test samples to and from an NMR spectrometer 1. Advantages of the invention can, however, also be used in a spectrometer that uses a different physical measuring technology, it thus being possible that corresponding appropriate modifications have to be carried out.

In the prior art, a transport apparatus of this kind for pneumatically conveying NMR test samples 2 from a region outside an NMR spectrometer 1 through a tubular transport channel 3 into the NMR spectrometer 1 and, from there, optionally after an NMR measurement has been carried out on the NMR test samples 2, back outside the NMR spectrometer 1 already comprises a device 4 for generating positive pressure in the end of the tubular transport channel 3 that is remote from the NMR spectrometer.

In contrast, the transport apparatus according to the invention is characterized in that the tubular transport channel 3 has a tube system which comprises a gas-tight outer tube 5 having an outer diameter $D_a$ and an inner diameter $d_a$ and an inner tube 6, arranged coaxially with respect to said outer tube, having an outer diameter $D_i<d_a$ and an inner diameter $d_i$, the inner diameter $d_i$ of the inner tube 6 being selected so as to be greater than or equal to the outer diameter $D_P$ of the NMR test samples 2, and in that the inner tube 6 comprises cross-holes 7 that are mutually spaced in the axial direction and are designed as through-holes.

In principle, the cross-holes 7 can be provided at any desired axial positions of the inner tube 6. In the embodiment of the invention shown in FIG. 1, however, said cross-holes are arranged equidistantly in the axial direction of the inner tube 6.

In this embodiment, there is furthermore a thermal insulator 8 surrounding the outer tube 5. In addition, a protective sleeve 9 surrounds the tube system 5, 6 in this case. Finally, in this embodiment of the invention the transport apparatus comprises a device 10 for generating negative pressure in the end of the tubular channel 3 that is nearer the NMR spectrometer. The "pseudo-conical" double tube system 5, 6 can therefore be both blown into with the device 4 and evacuated with the device 10.

Typically, the NMR test samples 2 are each located, during operation, in a preferably cylindrical sample test tube 2' having an outer diameter $D_{PR}$. During operation, these sample test tubes 2' are each sealed in a fluid-tight manner by a closure cap 2" which is attached at one end and has a maximum outer diameter $D_{VK}$. The sample test tubes 2' and the closure caps 2" are dimensioned in this case such that: $d_i \geq DYK > D_{PR}$.

Figure 2:
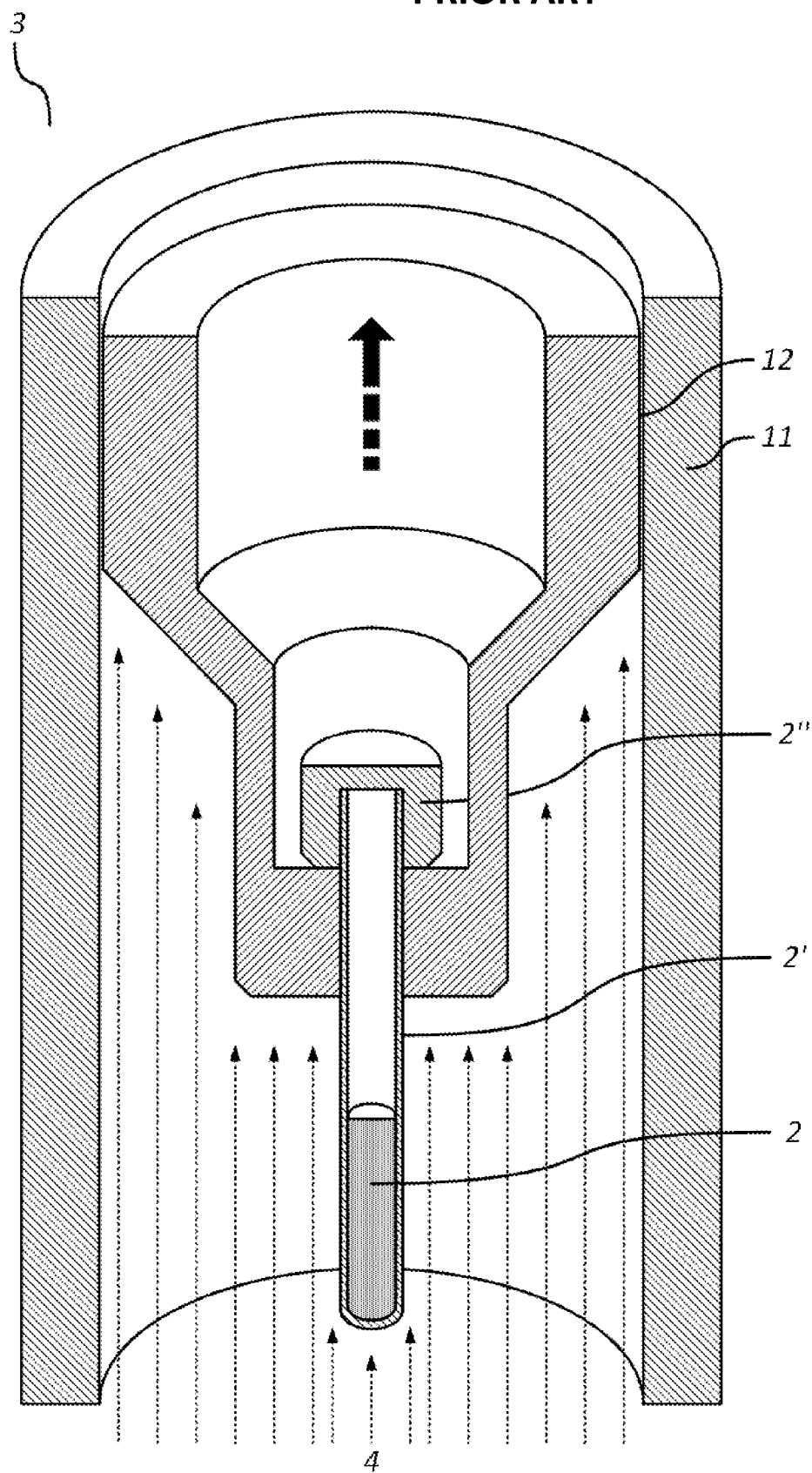
FIG. 2 is a schematic vertical sectional view of a transport apparatus according to the prior art.

FIG. 2 shows a transport apparatus according to the prior art. In this case, therefore, the double tube system 5, 6 according to the invention is omitted. Instead, the sample test tube 2' and its closure cap 2" are surrounded by a transport container 12, the outer contour of which is guided radially inside a standard transport tube 11.

In other embodiments (not shown individually in the present drawings) of the invention, the double tube system 5, 6 of the transport apparatus according to the invention may, however, also be arranged radially inside an existing conventional standard transport tube 11 according to the prior art, ensuring downward compatibility with existing apparatuses. In addition, in embodiments of the invention, the NMR test samples 2 are also surrounded by a transport container 12 during operation. However, said container usually has a significantly smaller mass $M_T$ than the transport container that is conventional in the prior art, i.e. $M_T<<50$ g, in particular $M_T<40$ g, preferably $M_T \leq 25$ g.

Figure 3:
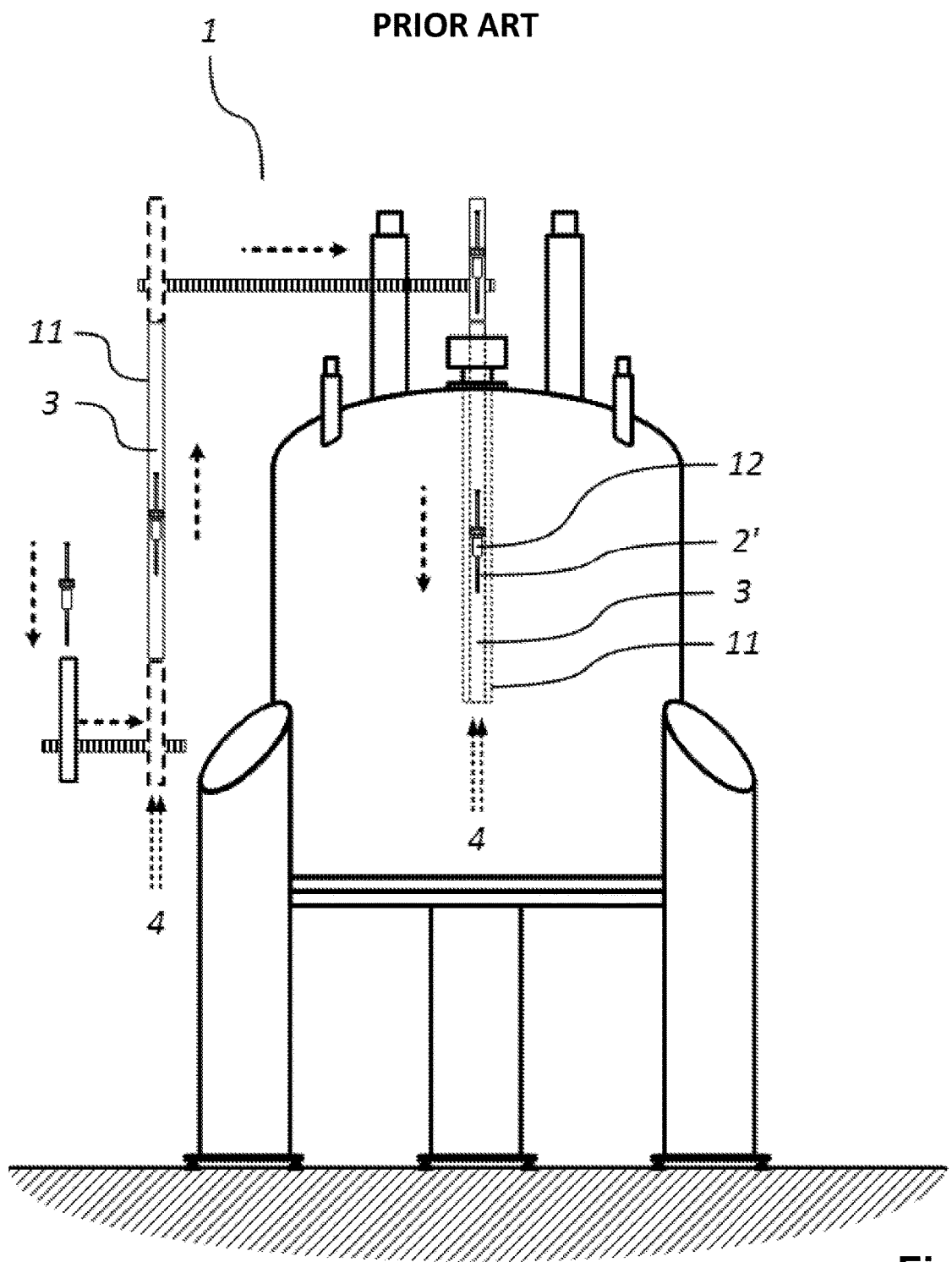
FIG. 3 is a partially transparent vertical sectional view of an NMR spectrometer having a transport apparatus according to the prior art.

FIG. 3 shows an NMR spectrometer 1 having a transport apparatus according to the prior art, which apparatus could, however, instead be exchanged for a transport apparatus according to the invention.

Figure 4:
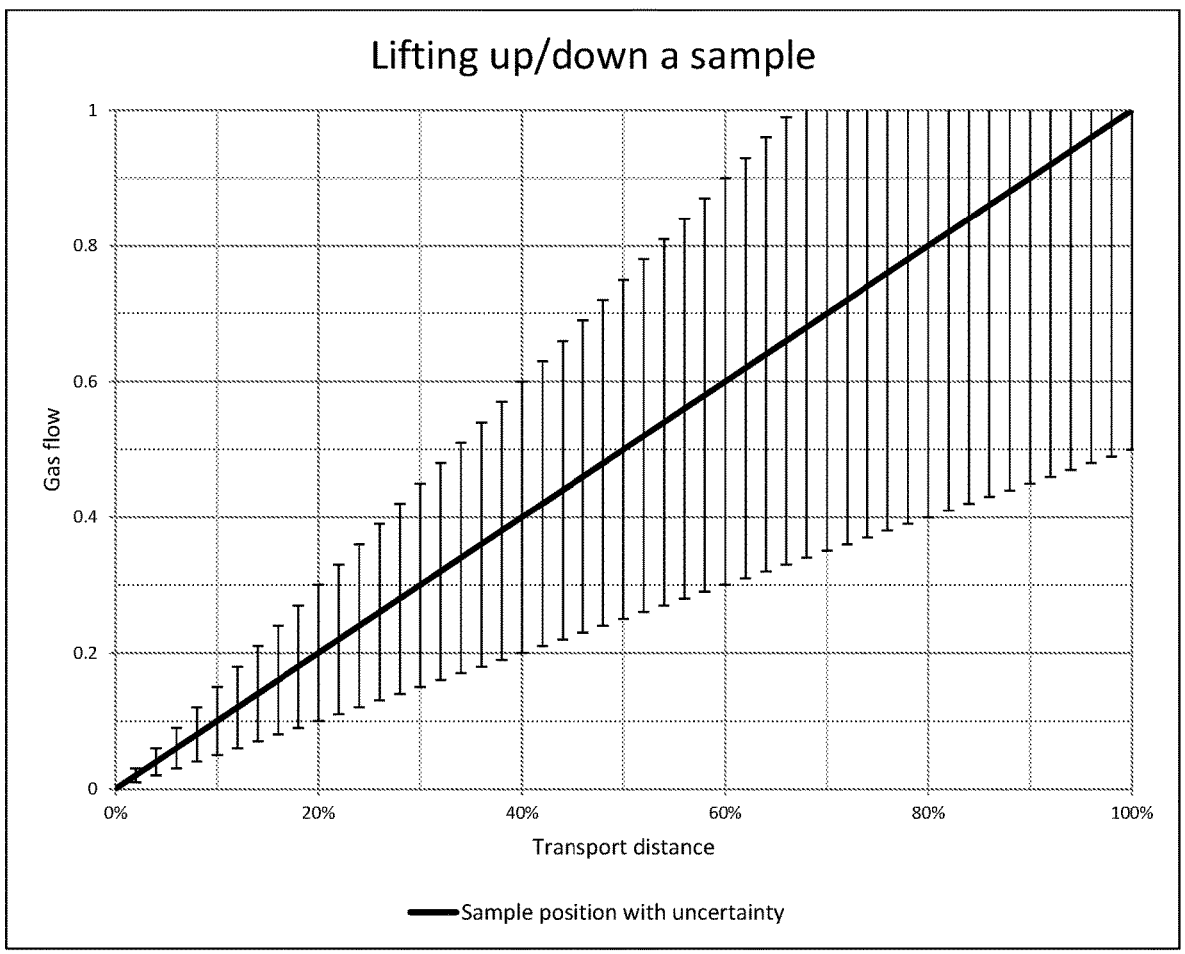
FIG. 4 shows the relationship between the distance covered by the NMR test sample in a transport apparatus according to the prior art and the magnitude of the gas flow, and a corresponding error bar for the axial position of the NMR test sample.

FIG. 4 is a diagram of the relationship between the distance covered by the NMR test sample in a transport apparatus according to the prior art and the magnitude of the gas flow, and a corresponding error bar for the axial position of the NMR test sample. In the currently-used transport systems according to the prior art, there is a large degree of uncertainty regarding the precise current position of the NMR test sample in the transport channel. This can be clearly seen from the constantly and somewhat significantly increasing height of the error bar in FIG. 4.

Figure 5:
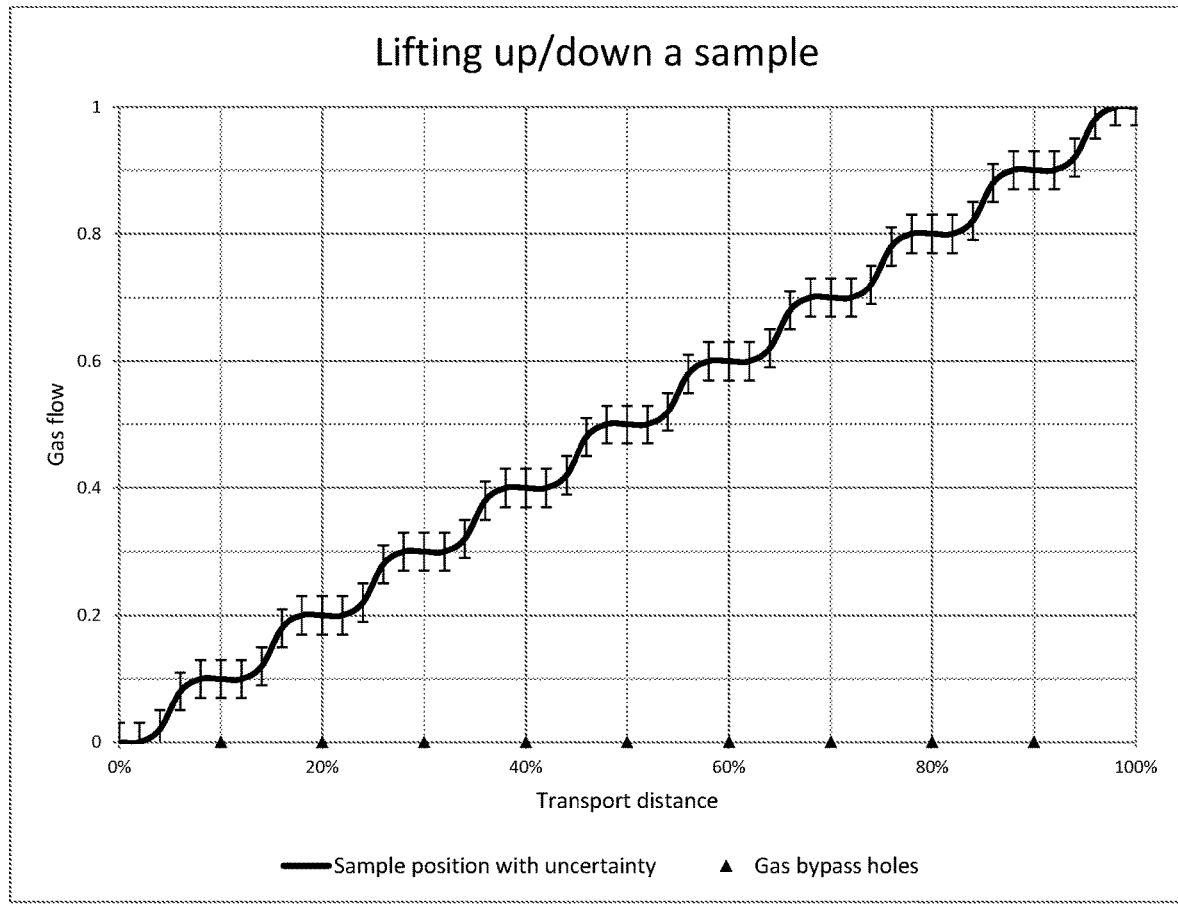
FIG. 5 shows the relationship from FIG. 4 in a transport apparatus according to the invention.

Finally, FIG. 5 shows the relationship between the distance covered by the NMR test sample in a transport apparatus according to the invention and the magnitude of the gas flow, and a corresponding error bar for the axial position of the NMR test sample.

The above-described modification according to the invention of the transport apparatus results in a fixed relationship between the gas flow and the position of the NMR test sample 2 in the transport channel 3, which is shown in FIG. 5 as a stepped curve. Each step corresponds to a position with the cross-holes 7 in the inner transport tube 6. As can be clearly seen, the height of the error bar in FIG. 5 remains the same over the entire transport distance. The relevant current position of the NMR test sample 2 during the transport thereof is therefore always fairly accurately defined.

As a result of completely omitting the transport carrier 12 or at least significantly reducing the size thereof, the total mass of the NMR test sample 2 to be transported is very small. A greater dynamic can therefore be achieved whilst there is simultaneously the smallest risk of damage to the NMR test sample. The potential total omission of the transport carrier additionally allows the inner tube 6, and therefore also the transport channel 3, to have the smallest possible dimensions (typically 9 mm instead of 26 mm as before). This produces a large amount of additional installation space, which can be used, for example, for thermal insulation 8 against the NMR magnet and for an additional protective sleeve 9. As a result, undesired changes in temperature in the NMR test sample 2 can be further reduced during transport into the NMR spectrometer 1.

LIST OF REFERENCE SIGNS

1 NMR spectrometer
2 NMR test sample
2' Sample test tubes
2" Closure cap
3 Transport channel
4 Device for generating positive pressure
5 Outer tube
6 Inner tube
7 Cross-holes
8 Thermal insulator
9 Protective sleeve
10 Device for generating negative pressure
11 Standard transport tube
12 Transport container

LIST OF REFERENCES

Publications taken into consideration for the assessment of patentability:
[1] DE 37 29 819 C2
[2] Company brochure Z31123: "Bruker Sample Transport. BST Installation and Technical Manual Version 002", Bruker BioSpin AG (21 Nov. 2008)
[3] EP 2 199 816 B1; U.S. Pat. No. 8,217,655 B2
[4] DE 10 2013 212 312 B4
[5] U.S. Pat. No. 6,768,305 B1
[6] DE 10 2014 201 076 B3
[7] DE 10 2018 201 226.1 (not yet published as of 13 Apr. 2018)

What is claimed is:

1. Transport apparatus for pneumatically conveying a nuclear magnetic resonance (NMR) test sample having an outer diameter $D_P$ from and/or to a region outside an NMR spectrometer into and/or out of the NMR spectrometer, comprising:
   a tubular transport channel configured to convey the test sample,
   a device producing positive pressure in an end of the tubular transport channel that is remote from the NMR spectrometer,
wherein the tubular transport channel comprises a tube system which comprises
   a gas-tight outer tube having an outer diameter $D_a$ and an inner diameter $d_a$ and
   an inner tube, arranged coaxially with respect to the outer tube, having an outer diameter $D_i < d_a$ and an inner diameter $d_i$, wherein the inner diameter $d_i$ of the inner tube is greater than or equal to the outer diameter Dr of the NMR test sample, and
wherein the inner tube comprises plural cross-holes that are mutually spaced apart along an axial direction of the inner tube and that are configured as through-holes.

2. Transport apparatus according to claim 1, wherein the cross-holes are arranged spaced equidistantly apart from one another along the axial direction of the inner tube.

3. Transport apparatus according to claim 1, further comprising a thermal insulator surrounding the outer tube.

4. Transport apparatus according to claim 1, further comprising a protective sleeve surrounding the tube system.

5. Transport apparatus according to claim 1, further comprising a device producing negative pressure in an end of the tubular transport channel that is nearer to the NMR spectrometer than is the remote end.

6. Transport apparatus according to claim 1, wherein the tube system is arranged radially inside a transport tube.

7. Transport apparatus according to claim 1, wherein the tube system has the following dimensions:
   outer diameter $D_a$ of the outer tube: 15 mm≤$D_a$≤30 mm;
   inner diameter $d_a$ of the outer tube: 10 mm≤$d_a$≤25 mm;
   outer diameter $D_i$ of the inner tube: 7.5 mm≤$D_i$≤15 mm;
   inner diameter $d_i$ of the inner tube: 5 mm≤$d_i$≤10 mm;
   axial distance $A_Q$ between the cross-holes: 50 mm≤$A_Q$≤300 mm.

8. Transport apparatus according to claim 7, wherein the tube system has the following dimensions:
   outer diameter $D_a$ of the outer tube: 18 mm≤$D_a$≤26 mm;
   inner diameter $d_a$ of the outer tube: 15 mm≤$d_a$≤20 mm;
   outer diameter $D_i$ of the inner tube: 10 mm≤$D_i$≤12 mm;
   inner diameter $d_i$ of the inner tube: 8.5 mm≤$d_i$≤9.5 mm.

9. Transport apparatus according to claim 1, wherein, during operation, the NMR test sample is surrounded by a transport container having a mass $M_T \ll 50$ g.

10. Transport apparatus according to claim 9, wherein the transport container has a mass $M_T \leq 25$ g.

11. Transport apparatus according to claim 1, wherein, during the conveying, a plurality of the NMR test samples are each located in a respective cylindrical sample test tube having an outer diameter $D_{PR}$, and during the conveying, the sample test tubes are each sealed in a fluid-tight manner by respective closure caps, which are attached at one end and have a maximum outer diameter $D_{VK}$.

12. Transport apparatus according to claim 11, wherein the sample test tubes and the closure caps are dimensioned such that: $d_i \geq D_{VK} > D_{PR}$.

13. Method for operating a transport apparatus as claimed in claim 1, comprising:
   (a) supplying an NMR test sample acquired from a feed point outside the NMR spectrometer through external parts of the transport channel to an entry point into the NMR spectrometer;
   (b) moving the NMR test sample into a spatial position for further transport into NMR magnets;

(c) introducing the NMR test sample through an internal part of the transport channel into a magnet center of the NMR spectrometer in a pneumatically controlled manner;

(d) carrying out an NMR measurement on the NMR test sample; and (e) pneumatically transporting the NMR test sample back out of the magnet center to outside the NMR spectrometer.

14. Method according to claim 13, further comprising transporting the measured NMR test sample through the external parts of the transport channel back to the feed point.

15. Method according to claim 13, further comprising:
spacing the cross-holes equidistantly in the axial direction of the inner tube, and
calculating a current axial position of the NMR test sample from a ratio of air escaping from the cross-holes to a total volumetric flow rate and a direct relationship that exists between the total volumetric flow rate and the axial position of the NMR test sample in the transport channel.

16. Method according to claim 13, further comprising maintaining the inner tube at a constant temperature during the NMR measurement using a thermal insulator surrounding the outer tube, wherein the constant temperature is thermally insulated from an unregulated temperature of the transport channel.

17. Method according to claim 13, wherein said carrying out of an NMR measurement comprises suctioning the NMR test sample into the NMR spectrometer with a device that produces a negative pressure in the tubular transport channel, and blowing at the NMR test sample with the device producing the positive pressure.

18. NMR spectrometer comprising a transport apparatus according to claim 1.

19. Transport apparatus according to claim 1, wherein the cross-holes are arranged in groups which are spaced equidistantly apart from one another along the axial direction of the inner tube.

* * * * *